US012505987B2

(12) United States Patent
Ho et al.

(10) Patent No.: US 12,505,987 B2
(45) Date of Patent: Dec. 23, 2025

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Yi Chen Ho, Taichung (TW); Chih Ping Liao, Hsinchu (TW); Shih Hao Yang, Tainan (TW); Wei-Ming Wang, Hsinchu (TW); Chien Ting Lin, Hsinchu (TW); Jie-Ying Yang, Yunlin County (TW); Chih-Che Tang, Tainan (TW); Kuo Kang Teng, Tainan (TW); Ming-Hui Yu, Taichung (TW); Ker-hsun Liao, Hsinchu (TW); Chi-Hsun Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 761 days.

(21) Appl. No.: 17/660,169

(22) Filed: Apr. 21, 2022

(65) Prior Publication Data

US 2023/0343559 A1 Oct. 26, 2023

(51) Int. Cl.
*H01J 37/32* (2006.01)
*C23C 16/455* (2006.01)
*C23C 16/52* (2006.01)

(52) U.S. Cl.
CPC .. *H01J 37/32449* (2013.01); *C23C 16/45591* (2013.01); *C23C 16/52* (2013.01); *H01J 2237/3321* (2013.01)

(58) Field of Classification Search
CPC .................... C23C 16/45591; C23C 16/45578
See application file for complete search history.

(56) References Cited

U.S. PATENT DOCUMENTS

| | | | |
|---|---|---|---|
| 11,633,753 B2 | 4/2023 | Abe et al. | |
| 2007/0141812 A1* | 6/2007 | Zagwijn ............ | C23C 16/45523 438/479 |
| 2011/0306212 A1 | 12/2011 | Sato et al. | |
| 2013/0167774 A1* | 7/2013 | Yang ................ | C23C 16/45587 118/728 |
| 2015/0259799 A1 | 9/2015 | Motoyama et al. | |

FOREIGN PATENT DOCUMENTS

| | | |
|---|---|---|
| CN | 102938389 A | 2/2013 |
| CN | 113265645 A | 8/2021 |
| TW | 201604312 A | 2/2016 |

* cited by examiner

*Primary Examiner* — Joseph A Miller, Jr.
(74) *Attorney, Agent, or Firm* — Harrity & Harrity, LLP

(57) ABSTRACT

Some implementations described herein provide techniques and apparatuses for overcoming forces that may deflect an injector nozzle into an interior wall of a thin-film furnace. The implementations include a fixture that is coupled to the injector nozzle. The fixture is configurable to lock to a selected property of the injector nozzle to maintain, between a portion of the injector nozzle and the interior wall, a gap. In this way, the portion of the injector nozzle is prevented from colliding with the interior wall and dislodging particulates that may contaminate semiconductor product fabricated using the thin-film furnace.

20 Claims, 14 Drawing Sheets

SEMICONDUCTOR PROCESSING TOOL AND METHODS OF OPERATION

BACKGROUND

A deposition tool, such as a thin-film furnace, includes a semiconductor processing tool that performs a deposition operation within a processing chamber to form a layer of a material over another layer of material on a semiconductor substrate. For example, the thin-film furnace may form a layer of a silicon nitride ($Si_xN_y$) material over a layer of a tetraethyl orthosilicate (TEOS) material. In some implementations, the thin-film furnace includes a gas distribution system that injects precursor gases into the processing chamber as part of the deposition operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
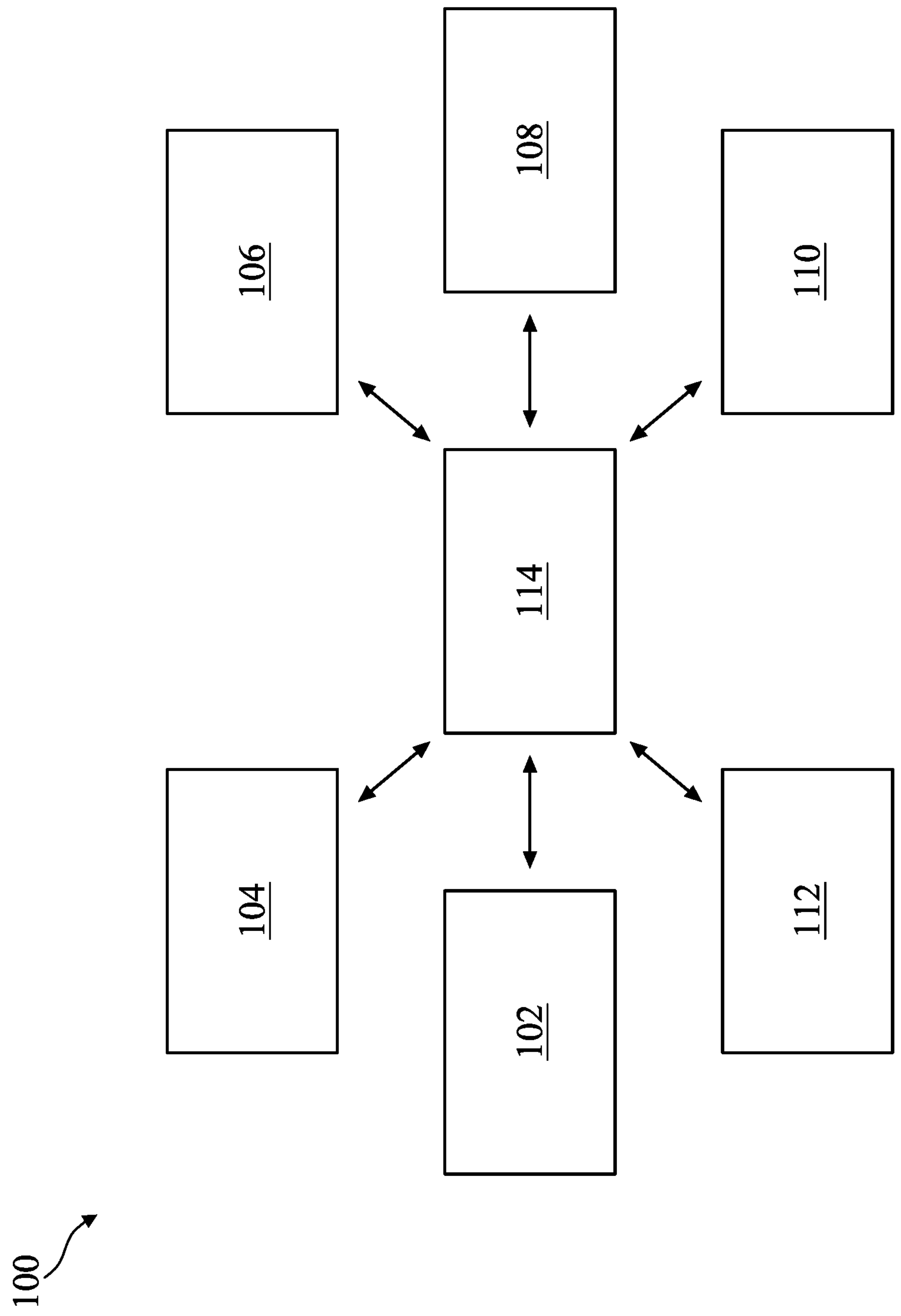
FIGS. 1A and 1B are diagrams of an example semiconductor processing environment including a deposition tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A chemical vapor deposition (CVD) process may be performed in a processing chamber of a thin-film furnace. The thin-film furnace may be a standalone tool or may be included in a cluster tool or another type of semiconductor processing system that includes a plurality of processing chambers. In some cases, the thin-film furnace includes an injector nozzle that is elongated along a path approximately parallel to an interior wall of the processing chamber.

The injector nozzle may provide precursor gases used in the CVD process through one or more exhaust ports along the injector nozzle. Forces (e.g., exhaust forces) may cause an end portion (e.g., a tip) and/or another portion of the injector nozzle to deflect and collide with an interior wall of the chamber. In such cases, particulates (e.g., particulates of a material from a prior CVD process) may become dislodged from the interior wall and contaminate semiconductor product fabricated using the thin-film furnace (e.g., integrated circuit devices being fabricated on a semiconductor substrate in the processing chamber of the thin-film furnace). The particulates may decrease a yield of the semiconductor product. The particulates may also increase a downtime or a cleaning frequency of the thin-film furnace to reduce an output capacity of the thin-film furnace.

Some implementations described herein provide techniques and apparatuses for overcoming forces that may deflect an injector nozzle into an interior wall of a thin-film furnace. The implementations include a fixture that is coupled to the injector nozzle. The fixture is configurable to lock to a selected property of the injector nozzle to maintain, between a portion of the injector nozzle and the interior wall, a gap. In this way, the portion of the injector nozzle is prevented from colliding with the interior wall and dislodging particulates that may contaminate semiconductor product fabricated using the thin-film furnace.

In this way, the portion (e.g., an end portion and/or another portion) is prevented from colliding with the interior wall and dislodging particulates that may contaminate semiconductor product fabricated using the thin-film furnace. By preventing the portion from colliding with the interior wall and dislodging the particulates, a yield of the semiconductor product fabricated using the thin-film furnace may increase. Furthermore, a downtime of the thin-film furnace for cleaning and maintenance may decrease to increase an output capacity of the thin-film furnace.

Figure 1B:
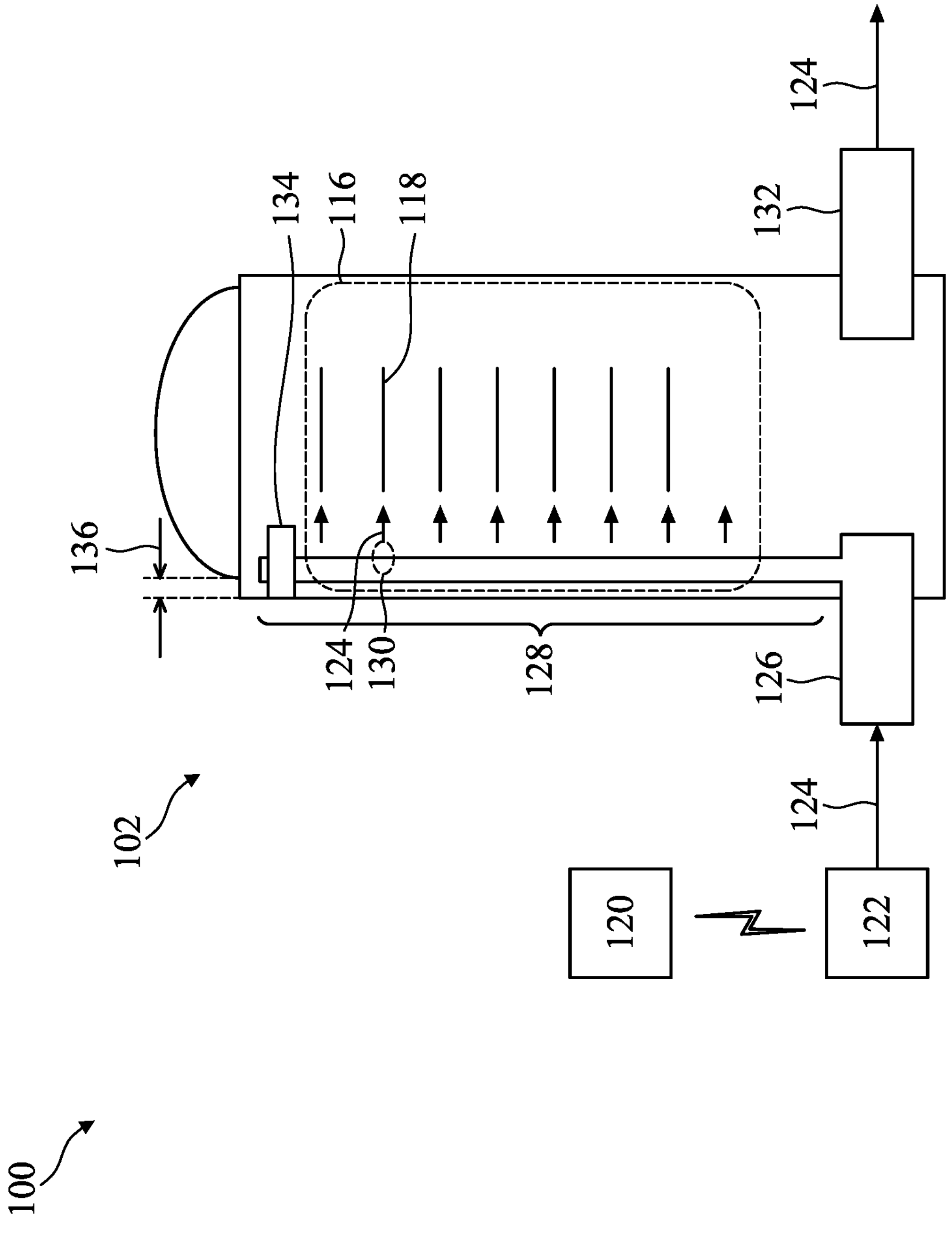

FIGS. 1A and 1B are diagrams of an example semiconductor processing environment 100 including a deposition tool described herein. As shown in FIG. 1A, environment 100 may include a plurality of semiconductor processing tools 102-112 and a wafer/die transport tool 114

The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated material handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 includes a programmed device that is configured to travel a particular path and/or may operate semi-autonomously or autonomously. In some implementations, the semiconductor processing environment 100 includes a plurality of wafer/die transport tools 114.

The wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, or processing chambers for performing different types of deposition operations, among other examples). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

FIG. 1B shows an example implementation of the deposition tool 102. The deposition tool 102 of FIG. 1B may correspond to a thin-film furnace that includes a processing chamber 116. As described in connection with FIGS.

3A-3D, the deposition tool 102 may perform a CVD process or an ALD process to deposit a layer of material (e.g., a thin-film material such as a silicon nitride (SiNi) material or a tetraethyl orthosilicate (TeOS) material over another layer of material on a semiconductor substrate 118 (e.g., wafer) within the processing chamber 116. However, other combinations and types of deposition tools, processing chambers, deposition processes, or materials are within the scope of the present disclosure.

As shown in FIG. 1B, the deposition tool 102 includes a gas distribution system. The gas distribution system includes a controller 120 communicatively coupled to a gas source 122. The controller 120 (e.g., a processor, a combination of a processor and memory, among other examples) may communicate with the gas source 122 (e.g., a valve controlling a flow of gas from a tank or reservoir, or a valve controlling flows of multiple types of gases from multiple gas supply lines, among other examples) to activate a flow of a gas 124 from the gas source 122, change a rate of the flow of the gas 124 from the gas source 122, or to change a mixture of the flow of the gas 124 from the gas source 122.

Although illustrated as separate from the deposition tool in FIG. 1B, in some implementations, the controller 120 is part of (e.g., integrated in and/or mounted to) the deposition tool 102. Similarly, although illustrated as separate from the deposition tool 102 in FIG. 1B, in some implementations, the gas source 122 is part of the deposition tool 102.

The gas 124 may include one or more precursors that react and/or decompose on a layer of a material over the semiconductor substrate 118 to produce a desired deposit (e.g., a desired layer of a thin-film material). As an example, the gas 124 may include a ruthenium (Ru) precursor. As another example, the gas 124 may include a tantalum nitride (TaN) precursor. The types of precursors identified above are intended as examples of precursors that could be used and other types of precursors may be included in the gas 124.

The gas distribution system includes a gas inlet 126 that passes through an interior wall of the processing chamber 116. The gas distribution system further includes an injector nozzle 128 that is elongated along a path that is approximately parallel to the interior wall. As an example, the injector nozzle 128 may be elongated along the path and have a length of approximately 1.31 meters. However, other lengths for the injector nozzle 128 are within the scope of the present disclosure.

The injector nozzle 128 may have a generally circular or elliptical shaped cross-section. However, other shapes for the injector nozzle 128 are within the scope of the present disclosure.

The injector nozzle 128 includes exhaust ports 130 configured to provide the flow of the gas 124 received from the gas inlet 126 into the processing chamber 116. The injector nozzle 128 may include a stainless steel material, among other examples. At least one of the exhaust ports 130 may face away from the interior wall and towards the semiconductor substrate 118. In some cases, one or more of the exhaust ports 130 may include a circular shape having an inside diameter of approximately 1.2 millimeters. However, other shapes and diameters for the exhaust ports 130 are within the scope of the present disclosure.

In some implementations, the exhaust ports 130 may include a linear array of the exhaust ports 130 spaced along the injector nozzle 128. For example, the linear array may include a quantity of 120 of the exhaust ports 130 spaced on a pitch of approximately 7.5 millimeters. However, other quantities and pitches for such a linear array are within the scope of the present disclosure.

The gas distribution system further includes a gas outlet 132. The flow of the gas 124 may exit the processing chamber 116 through the gas outlet 132.

In some implementations, one or more forces within the deposition tool 102 may cause an end portion (e.g., a tip) of the injector nozzle 128 to deflect towards the interior wall of the processing chamber 116. The one or more forces may include, for example, an exhaust force from the flow of the gas 124 through the exhaust ports 130 of the injector nozzle 128. Additionally, or alternatively, the one or more forces may include a vibration force from within the deposition tool 102 (e.g., a vibration force from a semiconductor substrate transfer system that is part of the deposition tool 102 or a harmonic vibration force, among other examples).

To prevent the end portion of the injector nozzle 128 from colliding with the interior wall of the processing chamber 116 and dislodging particulates, the gas distribution system includes a fixture 134. The fixture 134 is coupled to the end portion of the injector nozzle 128. In some implementations, the fixture 134 is further coupled to a structure of the processing chamber 116 (e.g., biased against the interior wall, bolted or welded to a frame of the processing chamber 116, or epoxied to another fixture within the processing chamber 116, among other examples).

The fixture 134 may be configured to overcome the forces that deflect the end portion of the injector nozzle 128 towards the interior wall of the processing chamber 116. In some implementations, and as described in connection with FIGS. 2A-2F, the fixture 134 is configured to lock to a selected property of the end portion of the injector nozzle 128.

Locking to the selected property of the end portion of the injector nozzle 128 may cause the fixture 134 to maintain a gap 136 between the end portion of the injector nozzle 128 and the interior wall of the processing chamber 116. The gap 136 may be in a range of approximately 0.5 centimeters to approximately 1.0 centimeters. If the gap 136 is less than this range, the end portion of the injector nozzle 128 may dislodge larger particulates. If the gap 136 is greater than this range, the injector nozzle 128 may warp or bend and not provide a sufficient distribution of the gas 124 within the processing chamber 116. However, other values and ranges for the gap 136 are within the scope of the present disclosure.

As described in connection with FIG. 1B and elsewhere herein, the deposition tool 102 may perform a method. For example, the method may include transmitting, by a controller 120 to a gas source 122 of a gas distribution system, a signal to initiate a flow of a gas 124 into a processing chamber 116 of the deposition tool 102. In some implementations, the gas distribution system provides the flow of the gas 124 through a gas inlet 126 passing through an interior wall of the processing chamber 116 and through an injector nozzle 128 that is elongated parallel to the interior wall. In some implementations, a fixture 134 is coupled to an end portion of the injector nozzle 128. In some aspects, the fixture 134 is coupled to another portion of the injector nozzle 128, such as a middle portion, a beginning portion, and/or another portion. The fixture 134 may be configured to overcome one or more forces that deflect the end portion (and/or another portion) of the injector nozzle 128 towards the interior wall. The fixture 134 may further be configurable to lock to a selected property of the end portion (and/or another portion) to maintain, between the end portion (and/or another portion) and the interior wall, a gap 136 to prevent the end portion (and/or another portion) from colliding with the interior wall and dislodging particulates. The method may further include transmitting, by the controller 120, another signal to the gas source 122 to stop the flow of the gas 124 into the processing chamber of the deposition tool 102.

As further described in connection with FIG. 1B and elsewhere herein, the deposition tool 102 may include a processing chamber 116 including an interior wall. The deposition tool 102 may also include an injector nozzle 128 extending from a gas inlet 126 along a path that is approximately parallel to the interior wall. In some implementations, the injector nozzle 128 includes exhaust ports 130 (e.g., a plurality of exhaust ports) configured to provide a flow of a gas 124 received from the gas inlet 126 into the processing chamber. The deposition tool 102 may also include a fixture 134 coupled to an end portion (and/or another portion) of the injector nozzle 128. In some implementations, the fixture 134 is configured to overcome a force, from the flow of the gas 124 through the exhaust ports 130, that deflects the end portion (and/or another portion) towards the interior wall. In some implementations, the fixture 134 is configurable to lock to a selected property of the end portion (and/or another portion) to maintain, between the end portion (and/or another portion) and the interior wall, a gap 136 to prevent the end portion (and/or another portion) from colliding with the interior wall and dislodging particulates.

The number and arrangement of tools shown in FIGS. 1A and 1B are provided as one or more examples. In practice, there may be additional tools, fewer tools, different tools, or differently arranged tools than those shown in FIGS. 1A and 1B. Furthermore, two or more tools shown in FIGS. 1A and 1B may be implemented within a single tool, or a single tool shown in FIGS. 1A and 1B may be implemented as multiple, distributed tools. Additionally, or alternatively, a set of tools (e.g., one or more tools) of environment 100 may perform one or more functions described as being performed by another set of tools of environment 100.

FIGS. 2A-2F are diagrams of an example implementation 200 described herein. The implementation 200 includes aspects of the fixture 134. One or more components of the fixture 134, as described in connection with FIGS. 2A-2F, may include a material that can withstand a temperature within the processing chamber 116 during a CVD deposition process. For example, one or more components of the fixture 134 may include a quartz material, a ceramic material, a stainless-steel material, or a hi-temperature plastic material that will not experience thermal damage at a temperature exceeding 150 degrees Celsius (° C.).

Figure 2A:
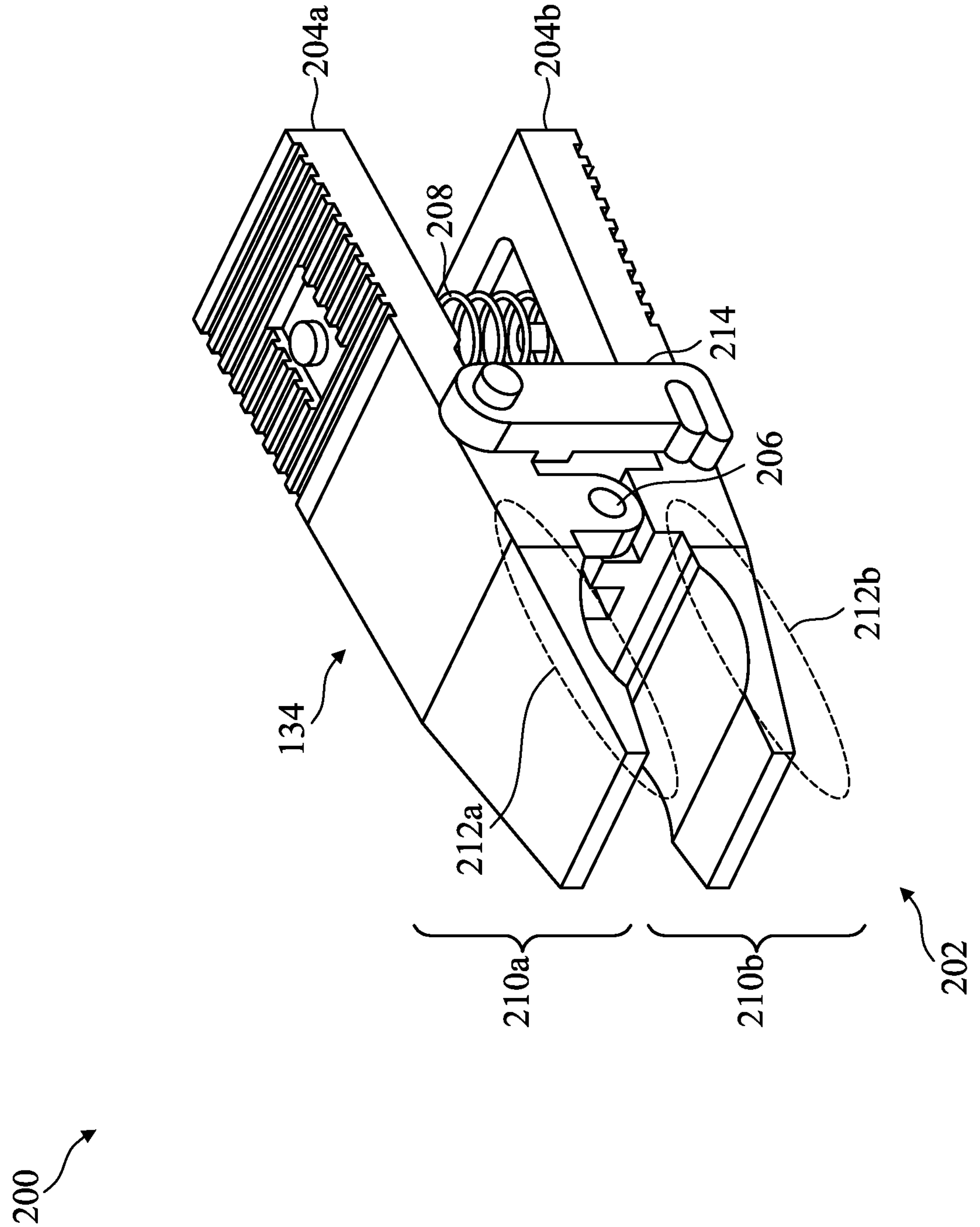
FIGS. 2A-2F are diagrams of an example implementation described herein.

Example 202 of FIG. 2A shows a perspective view of the fixture 134. As shown, the fixture 134 includes an arm 204*a* and another arm 204*b*. The arm 204*a* is connected to the arm 204*b* by a fulcrum 206. In FIG. 2A, a forcing component 208 (e.g., an elastic forcing component or spring, among other examples) provides a force that may create, in the arm 204*a* and the arm 204*b*, respective moment forces about the fulcrum 206. Additionally, or alternatively, another component, such as a pneumatic cylinder or a motor, may provide other forces that may create the respective moment forces about the fulcrum 206.

The arm 204*a* includes a blade region 210*a* including a cavity 212*a*. The arm 204*b* includes a blade region 210*b* including a cavity 212*b*. The cavity 212*a* and the cavity 212*b* may oppose (e.g., face) each other. In some implementations, the respective moment forces about the fulcrum 206 translate into a clamping force between the cavity 212*a* and the cavity 212*b* (e.g., a force that compresses and/or clamps the end portion (and/or another portion) of the injector nozzle 128 between the cavity 212*a* and the cavity 212*b*).

In some implementations, a shape of the cavity 212*a* approximates a portion of an exterior surface of the injector nozzle 128. In some implementations, another shape of the cavity 212*b* approximates another portion of the exterior surface of the injector nozzle 128. The shape of the cavity 212*a* and/or the other shape of the cavity 212*b* may include one or more curved portions to approximate a circular or elliptical shape of a cross-section of the end portion (and/or another portion) of the injector nozzle 128, among other examples. Additionally, or alternatively, the shape of the cavity 212*a* and/or the other shape of the cavity 212*b* may include one or more linear portions to approximate a square shape or a rectangular shape of the cross-section of the end of the injector nozzle 128, among other examples. However, other shapes for the cavity 212*a*, the cavity 212*b*, and/or the cross-section of the end of the injector nozzle 128 are within the scope of the present disclosure.

The fixture 134 includes a buckle component 214 (e.g., a locking component). As described in connection with FIG. 2C, the buckle component 214 may fix a distance between the cavity 212*a* and the cavity 212*b*. Additionally, or alternatively, another type of locking component such as a clasp component, a set screw component, or a spring-loaded pin component may fix the distance between the cavity 212*a* and the cavity 212*b*, among other examples.

Figure 2B:
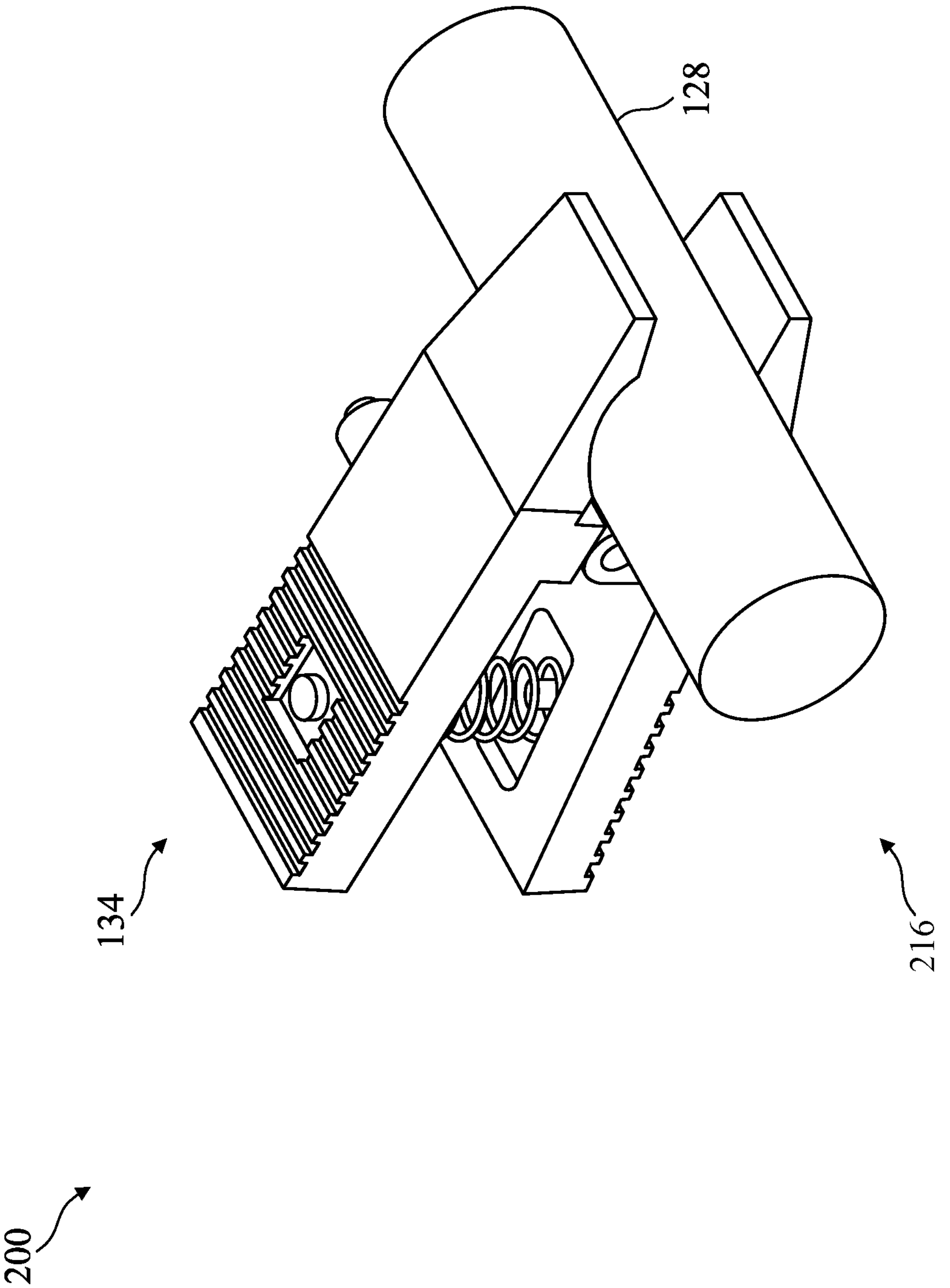

In example 216 of FIG. 2B, the end portion (and/or another portion) of the injector nozzle 128 is clamped by the fixture 134 (e.g., captured between the cavity 212*a* and the cavity 212*b*, or compressed between the cavity 212*a* and the cavity 212*b*).

Figure 2C:
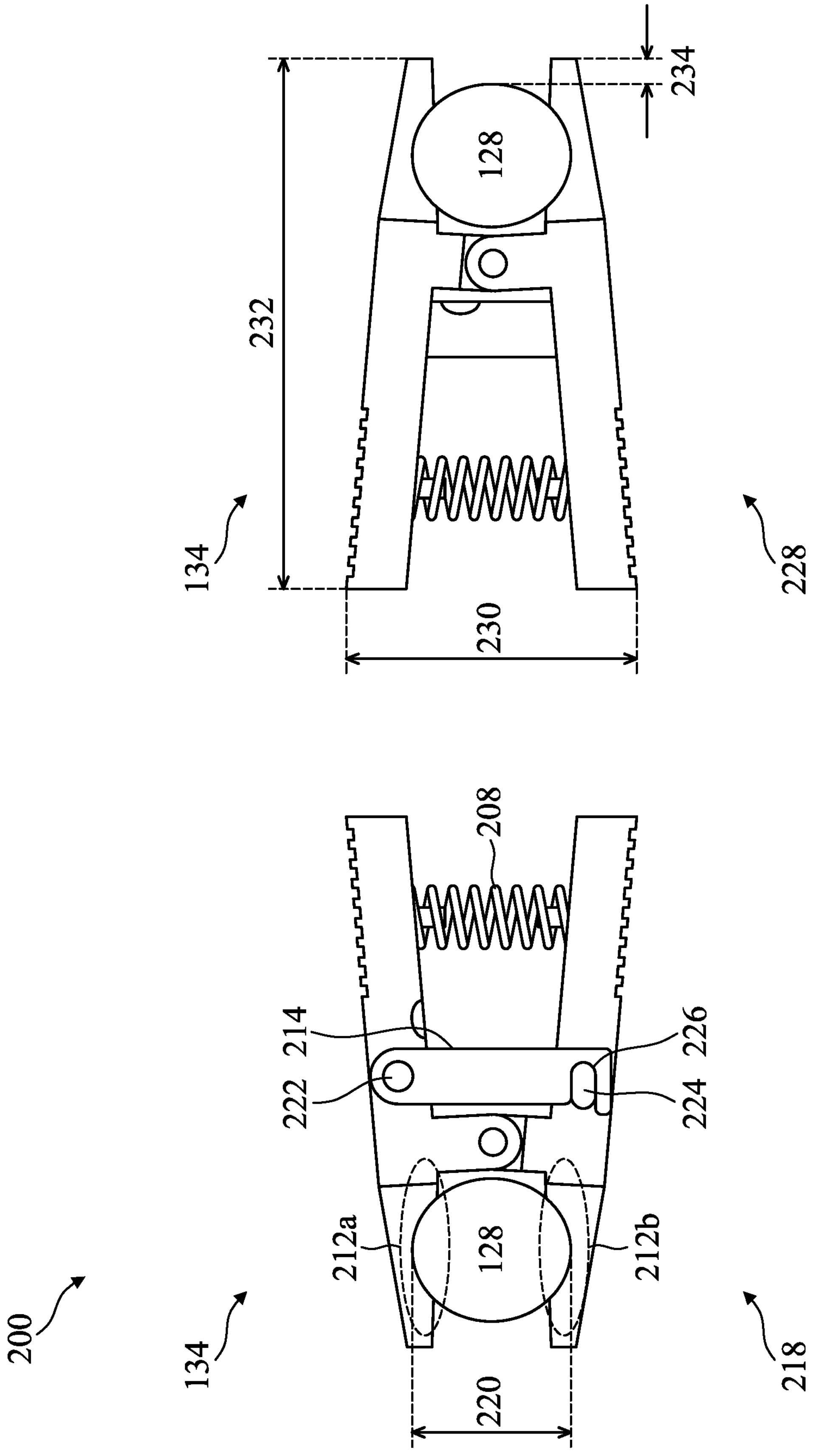

FIG. 2C shows additional aspects of the fixture 134. Example 218 on the left side of FIG. 2C includes a side view of the fixture 134 and shows a distance 220 between the cavity 212*a* and the cavity 212*b*. In some implementations, and as shown, the distance 220 may correspond to a distance between an apex of the cavity 212*a* and an apex of the cavity 212*b*.

As shown, the buckle component 214 is connected to the fixture 134 using a retaining pin 222. The buckle component 214 may pivot or rotate about the retaining pin 222. A capture pin 224 may capture a crenulation 226 (e.g., a cavity, a recess, or a divot, among other examples) near an end of the buckle component 214 to lock to a selected property of the end portion (and/or another portion) of the injector nozzle 128. For example, and as shown, the selected property of the end portion (and/or another portion) of the injector nozzle 128 may correspond to a diameter of a cross-section of the injector nozzle 128 (e.g., the distance 220). As an example, the diameter (e.g., the distance 220) may be approximately 25.0 millimeters. However, other values for the diameter (and the distance 220) are within the scope of the present disclosure.

In some implementations, the selected property of the end portion (and/or another portion) of the injector nozzle 128 corresponds to a shape of a cross-section of the end portion (and/or another portion) of the injector nozzle 128 (e.g., a circular cross-section, a square cross-section, or an elliptical cross-section, among other examples). In such cases, portions of the cavity 212*a* and/or the cavity 212*b* may be modified or altered from the illustration of FIG. 2C to accommodate one or more different shapes. Furthermore, a shape, length, or position of the buckle component 214 may be modified or altered from the illustration of FIG. 2C to accommodate the one or more different shapes (e.g., the buckle component 214 may include angled portions or curved portions, or be located differently than as shown in FIG. 2C, to accommodate different shapes of the end portion (and/or another portion) of the injector nozzle 128).

In some cases, the forcing component 208 may fail or weaken to reduce the force (e.g., clamping or capturing force) between the cavity 212*a* and the cavity 212*b*. In some other cases, forces within the processing chamber 116 (e.g., vibration forces, momentum of the injector nozzle 128, exhaust forces) may exceed a threshold (e.g., a force threshold) relating to compression or clamping forces provided by the forcing component 208. In such cases, the buckle component 214 may prevent the end portion (and/or another portion) of the injector nozzle 128 from slipping from the cavities 212*a* and 212*b* (e.g., maintain the distance 220 to retain the end portion (and/or another portion) of the injector nozzle 128 between the cavities 212*a* and 212*b*) and prevent the end portion (and/or another portion) of the injector nozzle 128 from colliding with the interior wall of the processing chamber 116.

In some implementations, the buckle component 214 may absorb forces that would otherwise be absorbed the forcing component 208. In such cases, a useful life of the fixture 134, including the forcing component 208, may be lengthened.

Example 228 shown on the right side of FIG. 2C shows example dimensions of the fixture 134, including an example height 230 and an example length 232. The example height 230 may be included in a range of approximately 46.6 millimeters to approximately 51.4 millimeters. The example length 232 may be included in a range of approximately 92.1 millimeters to approximately 101.9 millimeters. If the height 230 and/or the length 232 are greater or lesser than the described respective ranges, the fixture 134 may include mechanical incompatibilities that render the fixture 134 less operable with the injector nozzle 128 and/or the deposition tool 102. However, other values and ranges for the height 230 and the length 232 are within the scope of the present disclosure.

An offset 234 may be included in the fixture 134. The offset 234 may be dependent on factors that include a shape (e.g., an elliptical shape, a round shape, or a square shape, among other examples) of the cross-section of the end portion (and/or another portion) of the injector nozzle 128, a targeted gap (e.g., the gap 136), an orientation of the end portion (and/or another portion) of the injector nozzle 128 within the fixture 134, or a clamping location of the end portion (and/or another portion) of the injector nozzle 128 within the fixture 134. As an example, the offset 234 may be included in a range of approximately 4.8 millimeters to approximately 5.3 millimeters. If the offset 234 is greater or lesser than the described range, the fixture 134 may include mechanical incompatibilities that render the fixture 134 less operable with the injector nozzle 128 and/or the deposition tool 102. However, other values and ranges for the offset 234 are within the scope of the present disclosure.

Figure 2D:
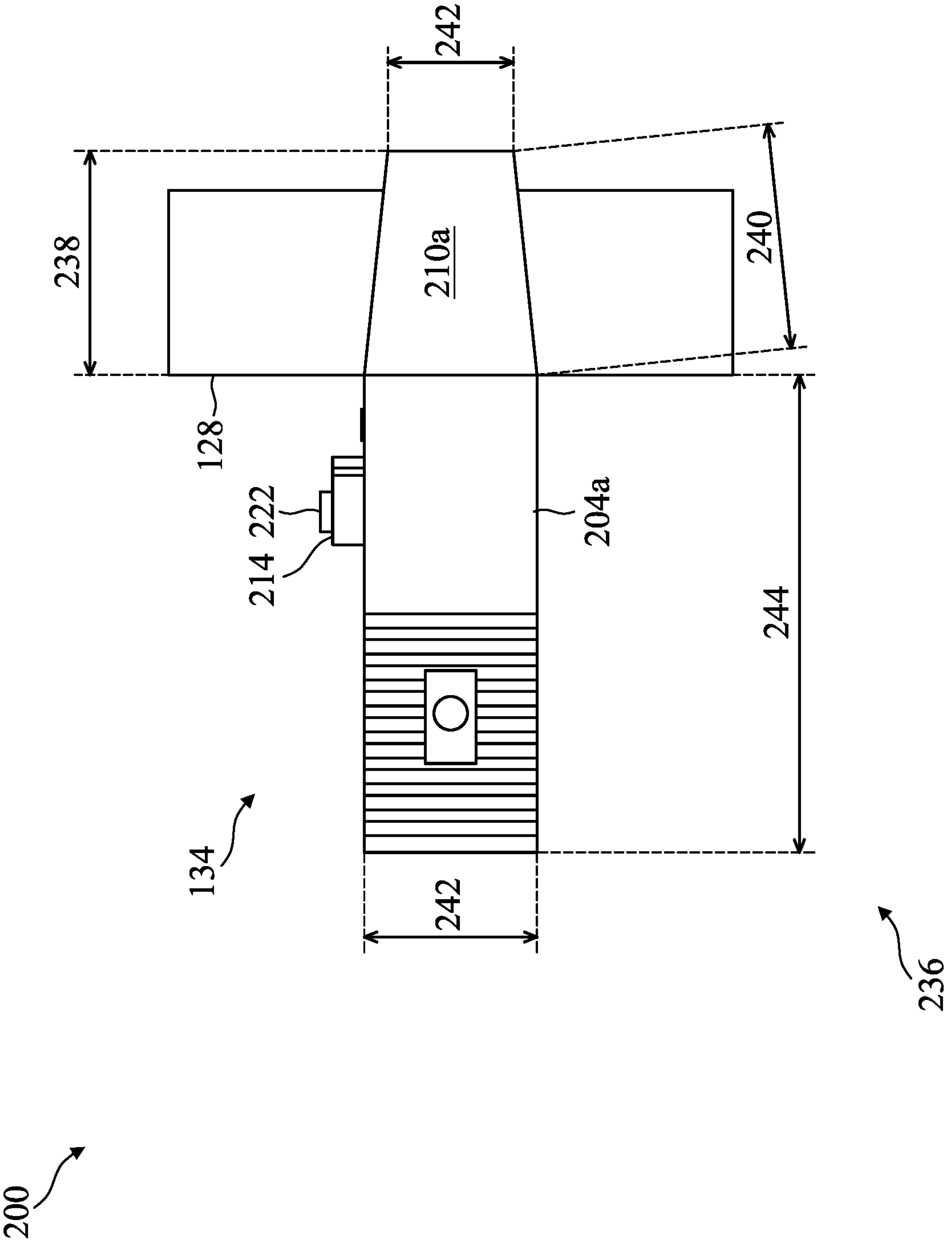

FIG. 2D shows example 236 including a top view of the fixture 134. The top view includes the end portion (and/or another portion) of the injector nozzle 128, the arm 204*a*, the blade region 210*a*, the buckle component 214, and the retaining pin 222.

As shown in FIG. 2D, a length 238 of the blade region 210*a* may be included in a range of approximately 29.5 millimeters to approximately 30.5 millimeters. An angular length 240 of the blade region 210*a* may be included in a range of approximately 32.5 millimeters to approximately 34.0 millimeters. A width 242 of a tip of the blade region 210*a* may be included in a range of approximately 24.5 millimeters to approximately 25.5 millimeters. If the length 238, the angular length 240, and/or the width 242 are greater or lesser than the described respective ranges, the fixture 134 may include mechanical incompatibilities that render the fixture 134 less operable with the injector nozzle 128 and/or the deposition tool 102. However, other values and ranges for the length 238, the angular length 240, and the width 242 are within the scope of the present disclosure.

Also as shown in FIG. 2D, a width 242 of the arm 204*a* may be included in a range of approximately 29.5 millimeters to approximately 30.5 millimeters. A length 244 of the arm 204*a* may be included in a range of approximately 59.0 millimeters to approximately 61.0 millimeters. If the width 242 and/or the length 244 are greater or lesser than the described respective ranges, the fixture 134 may include mechanical incompatibilities that render the fixture 134 less operable with the injector nozzle 128 and/or the deposition tool 102. However, other values and ranges for the width 242 and the length 244 are within the scope of the present disclosure.

Figure 2E:
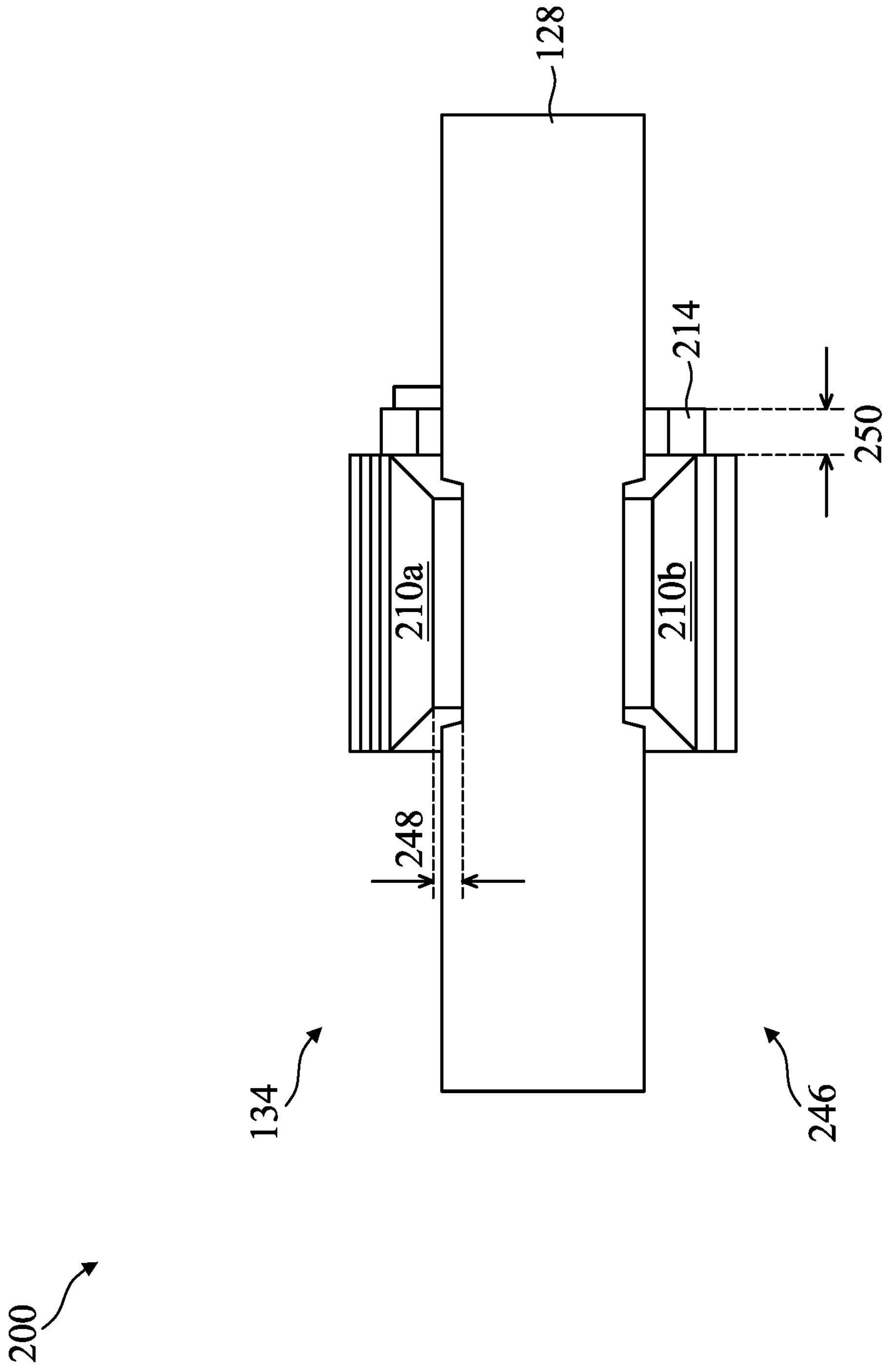

FIG. 2E shows example 246 including an end view of the fixture 134, including the injector nozzle 128, the blade region 210*a*, the blade region 210*b*, and the buckle component 214. As shown, an end thickness 248 of the blade region 210*a* may be included in a range of approximately 7.0 millimeters to approximately 10.0 millimeters. A width 250 of the buckle component 214 may be included in a range of approximately 1.0 millimeter to approximately 8.0 millimeters. If the end thickness 248 and/or the width 250 are greater or lesser than the described respective ranges, the fixture 134 may include mechanical incompatibilities that render the fixture 134 less operable with the injector nozzle 128 and/or the deposition tool 102. However, other values and ranges for the end thickness 248 and the width 250 are within the scope of the present disclosure.

Figure 2F:
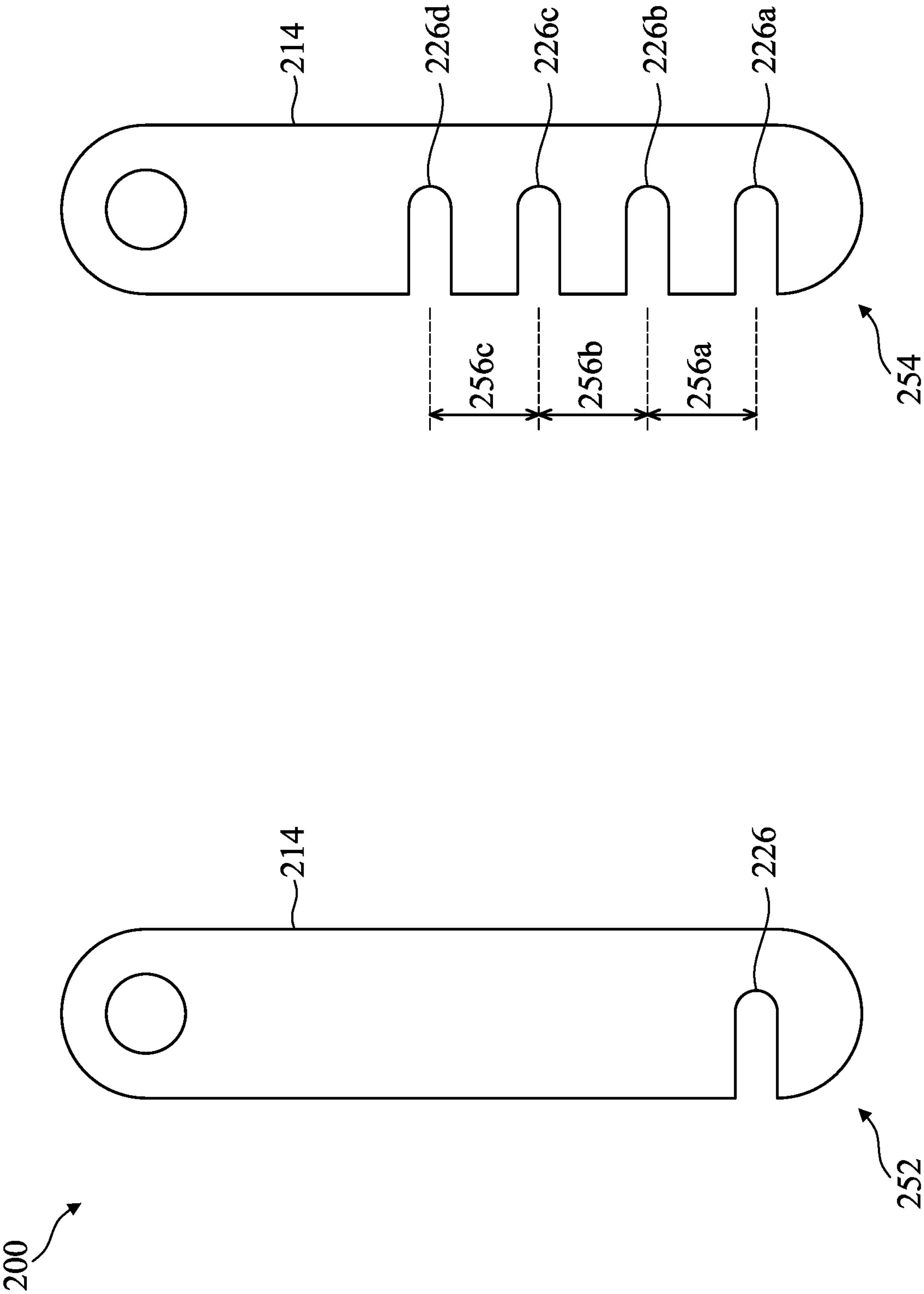

FIG. 2F shows example aspects of the buckle component 214. Example 252 on the left side of FIG. 2F shows the buckle component 214 including a single crenulation 226. In some implementations, including a single crenulation 226 simplifies clamping of the end portion (and/or another portion) of the injector nozzle 128 within the fixture 134. In some implementations, including the single crenulation 226 simplifies manufacturing of the buckle component 214.

Example 254 on the right side of FIG. 2F shows the buckle component 214 including multiple crenulations 226*a*-226*d*. A distribution of the multiple crenulations 226*a*-226*d* may include multiple pitches 256*a*-256*c*. Such a distribution may be used to adjust the buckle component 214 and fix the distance 220 between the cavity 212*a* and the cavity 212*b* to a selected distance. In some implementations, the buckle component 214 may include markings and/or a scale to aid selecting a setting (e.g., selecting a crenulation from the multiple crenulations 226*a*-226*d* to achieve a desired distance 220, among other examples). Furthermore, the buckle component 214 including the multiple crenulations 226*a*-226*d* may be used in different configurations of the deposition chamber 102 that involve different sizes of the injector nozzle 128.

In some implementations, the multiple pitches 256*a*-256*c* include a same pitch (e.g., the pitch 256*a* is equivalent to the pitch 256*b*, and the pitch 256*b* is equivalent to the pitch 256*c*). In some implementations, at least one pitch of the multiple pitches 256*a*-256*c* is different than another pitch (e.g., the pitch 256*a* is greater than the pitch 256*b*, among other examples).

As described in connection with FIGS. 2A-2F and elsewhere herein, the fixture 134 includes a first arm 204*a* comprising a first blade region 210*a*. In some implementations, the first blade region 210*a* includes a first cavity 212*a* having a first shape that approximates a first portion of an exterior surface of an injector nozzle 128 of a deposition tool 102. The fixture 134 also includes a second arm 204*b* including a second blade region 210*b*. In some implementations, the second blade region 210*b* includes a second cavity 212*b* having a second shape that approximates a second portion of the exterior surface of the injector nozzle 128 for the deposition tool 102. The second blade region 210*b* and the second cavity 212*b* may oppose the first blade region 210*a* and the first cavity 212*a*. The fixture 134 includes a fulcrum 206 connecting the first arm 204*a* to the second arm 204*b* and a forcing component 208 (e.g., an elastic forcing component) to create, in the first arm 204*a* and the second arm 204*b*, respective moment forces about the fulcrum 206. In some implementations, the respective moment forces translate into a clamping force between the first cavity 212*a* and the second cavity 212*b*. The fixture 134 further includes a locking component to fix a distance 220 between the first cavity 212*a* and the second cavity 212*b*.

The number and arrangement of components shown in FIGS. 2A-2F are provided as one or more examples. In practice, there may be additional components, fewer components, or differently arranged components than those shown in FIGS. 2A-2F. Furthermore, two or more components of FIGS. 2A-2F may be implemented within a single fixture 134 or implemented within multiple, separate fixtures 134.

Figure 3A:
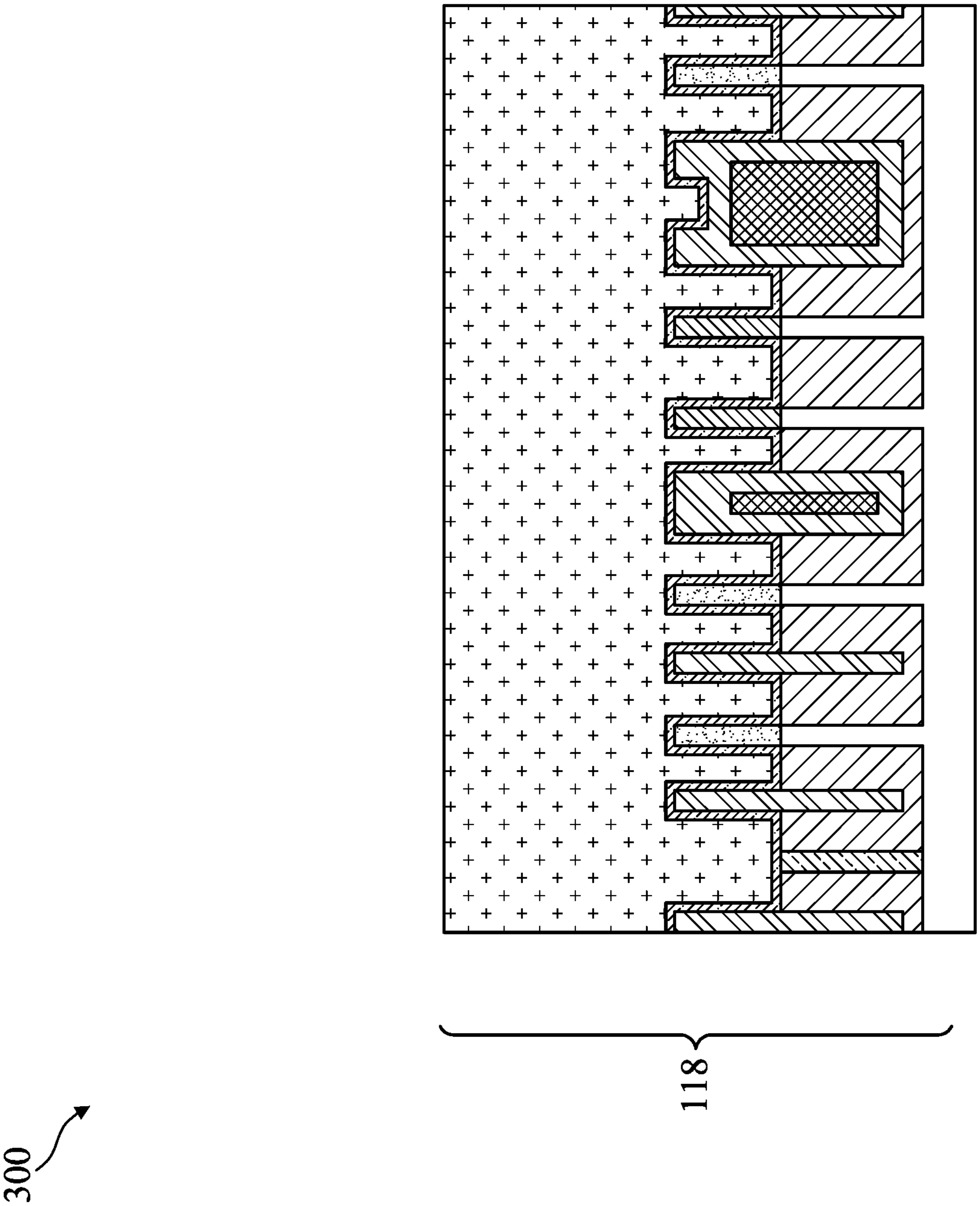
FIGS. 3A-3D are diagrams of an example series of semiconductor processing operations performed by a deposition tool described herein.

FIGS. 3A-3D are diagrams of an example series 300 of semiconductor processing operations performed by the deposition tool 102 described herein. In the example series 300, and as shown in FIG. 3A, the semiconductor substrate 118 includes partially-formed integrated circuitry. The partially-formed integrated circuitry may include, for example, one or more of a partially-formed memory cell, a partially-formed transistor, a partially formed input/output, or a partially-formed ring oscillator, among other examples.

Figure 3B:
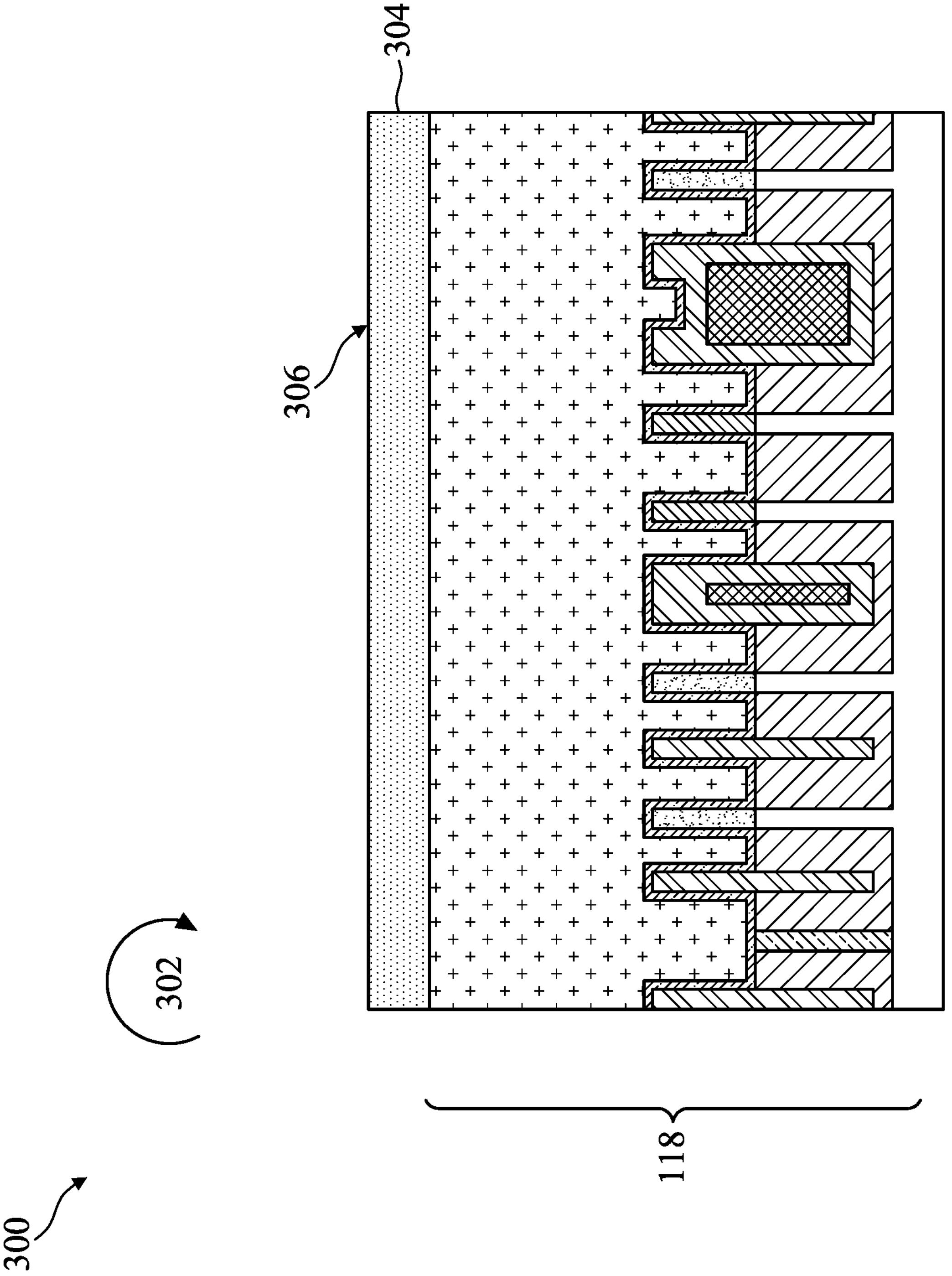

FIG. 3B shows an example semiconductor processing operation 302. As part of the semiconductor processing operation 302, the deposition tool 102 may perform a CVD deposition process that deposits a layer 304 of a silicon nitride ($Si_xN_y$) material, over the semiconductor substrate 118 and over the partially-formed integrated circuitry. In some implementations, and as described in connection with FIGS. 1A, 1B, and 2A-2F, the fixture 134 prevents the end portion (and/or another portion) of the injector nozzle 128 from colliding with the interior wall of the processing chamber 116 and dislodging particulates during the semiconductor processing operation 302. Accordingly, a likelihood of contamination on a surface 306 of the layer 304 is reduced.

Figure 3C:
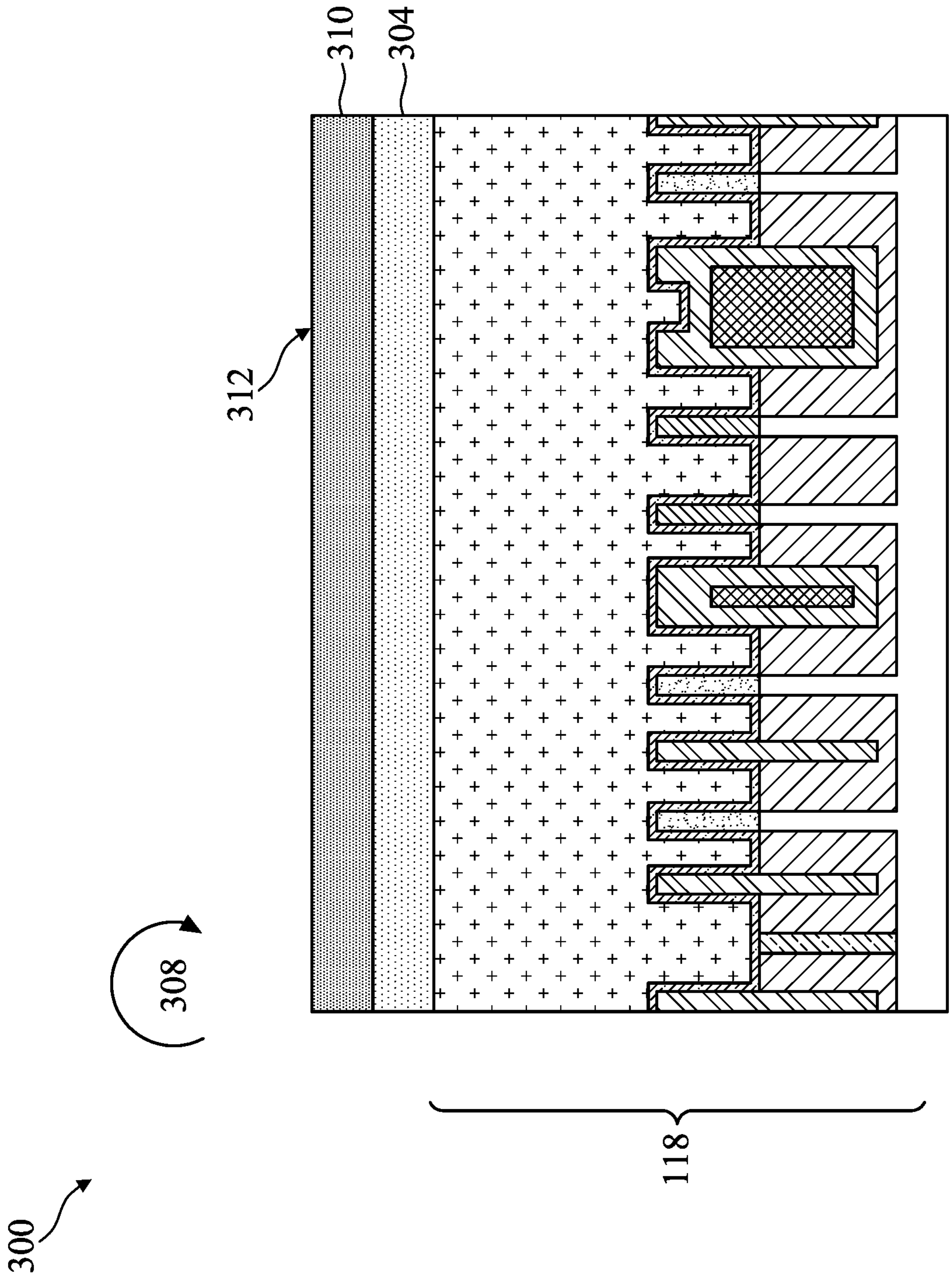

FIG. 3C shows another example semiconductor processing operation 308. As part of the semiconductor processing operation 308, the deposition tool 102 may perform a CVD deposition process that deposits a layer 310 of a tetraethyl orthosilicate (TEOS) material over the layer 304. In some implementations, and as described in connection with FIGS. 1A, 1B, and 2A-2F, the fixture 134 prevents the end portion (and/or another portion) of the injector nozzle 128 from colliding with the interior wall of the processing chamber 116 and dislodging particulates during the semiconductor processing operation 308. Accordingly, a likelihood of contamination on a surface 312 of the layer 310 is reduced.

Figure 3D:
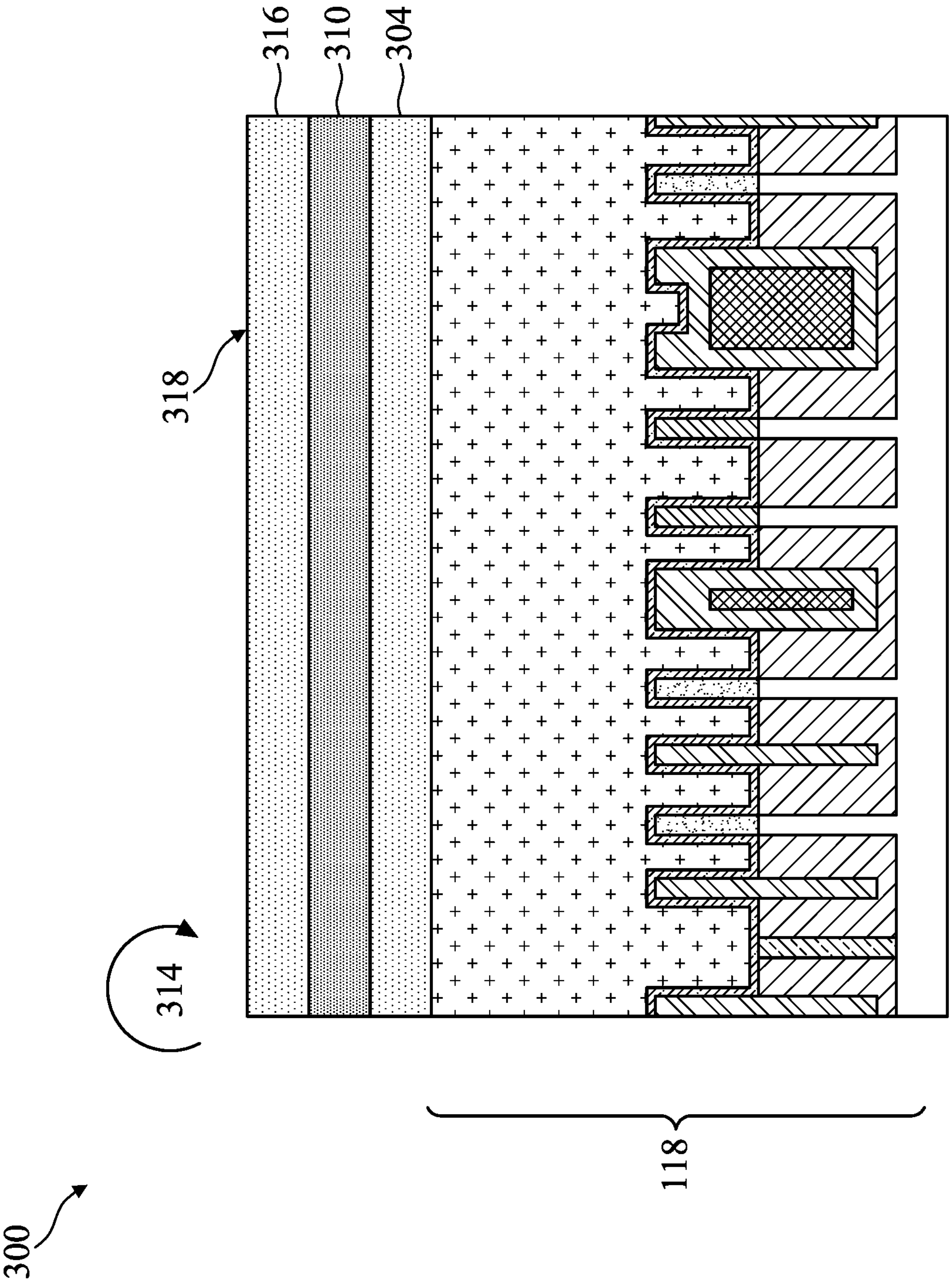

FIG. 3D shows another example semiconductor processing operation 314. As part of the semiconductor processing operation 314, the deposition tool 102 may perform a CVD deposition process that deposits a layer 316 of a silicon nitride ($Si_xN_y$) material over the layer 310. In some implementations, and as described in connection with FIGS. 1A, 1B, and 2A-2F, the fixture 134 prevents the end portion (and/or another portion) of the injector nozzle 128 from colliding with the interior wall of the processing chamber 116 and dislodging particulates during the semiconductor processing operation 314. Accordingly, a likelihood of contamination on a surface 318 of the layer 316 is reduced.

By reducing the likelihood of contamination on one or more of the surfaces 306, 312, or 318, subsequent semiconductor processing operations to complete the integrated circuitry (e.g., a deposition of a photoresist layer, an exposure of a photoresist layer, among other semiconductor processing operation examples) may be free of distortions and/or defects that reduce a yield of semiconductor product fabricated using the deposition tool 102. Furthermore, a downtime or a cleaning frequency of the deposition tool 102 may be reduced to increase an output of semiconductor product from the deposition tool 102.

Figure 4:
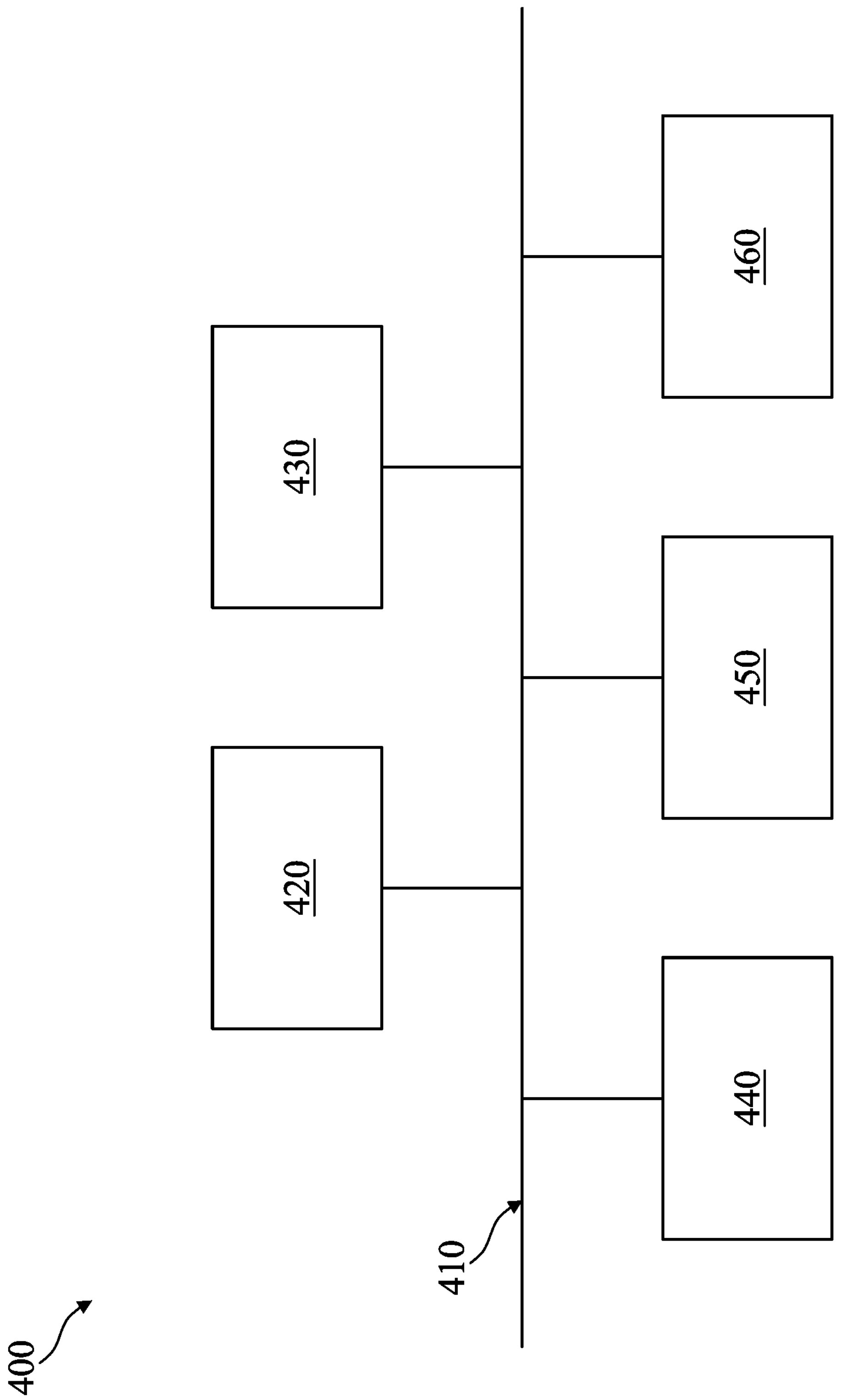
FIG. 4 is a diagram of example components of one or more devices of FIGS. 1A and 1B described herein.

FIG. 4 is a diagram of example components of one or more devices 400 of FIGS. 1A and 1B described herein, which may correspond to the controller 120 and/or the deposition tool 102. In some implementations, the controller 120 and/or the deposition tool 102 include one or more devices 400 and/or one or more components of device 400. As shown in FIG. 4, device 400 may include a bus 410, a processor 420, a memory 430, an input component 440, an output component 450, and a communication component 460.

Bus 410 includes one or more components that enable wired and/or wireless communication among the components of device 400. Bus 410 may couple together two or more components of FIG. 4, such as via operative coupling, communicative coupling, electronic coupling, and/or electric coupling. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform one or more operations or processes described elsewhere herein.

Memory 430 includes volatile and/or nonvolatile memory. For example, memory 430 may include random access memory (RAM), read only memory (ROM), a hard disk drive, and/or another type of memory (e.g., a flash memory, a magnetic memory, and/or an optical memory). Memory 430 may include internal memory (e.g., RAM, ROM, or a hard disk drive) and/or removable memory (e.g., removable via a universal serial bus connection). Memory 430 may be a non-transitory computer-readable medium. Memory 430 stores information, instructions, and/or software (e.g., one or more software applications) related to the operation of device 400. In some implementations, memory 430 includes one or more memories that are coupled to one or more processors (e.g., processor 420), such as via bus 410.

Input component 440 enables device 400 to receive input, such as user input and/or sensed input. For example, input component 440 may include a touch screen, a keyboard, a keypad, a mouse, a button, a microphone, a switch, a sensor, a global positioning system sensor, an accelerometer, a gyroscope, and/or an actuator. Output component 450 enables device 400 to provide output, such as via a display, a speaker, and/or a light-emitting diode. Communication component 460 enables device 400 to communicate with other devices via a wired connection and/or a wireless connection. For example, communication component 460 may include a receiver, a transmitter, a transceiver, a modem, a network interface card, and/or an antenna.

Device 400 may perform one or more operations or processes described herein. For example, a non-transitory computer-readable medium (e.g., memory 430) may store a set of instructions (e.g., one or more instructions or code) for execution by processor 420. Processor 420 may execute the set of instructions to perform one or more operations or processes described herein. In some implementations, execution of the set of instructions, by one or more processors 420, causes the one or more processors 420 and/or the device 400 to perform one or more operations or processes described herein. In some implementations, hardwired circuitry is used instead of or in combination with the instructions to perform one or more operations or processes described herein. Additionally, or alternatively, processor 420 may be configured to perform one or more operations or processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
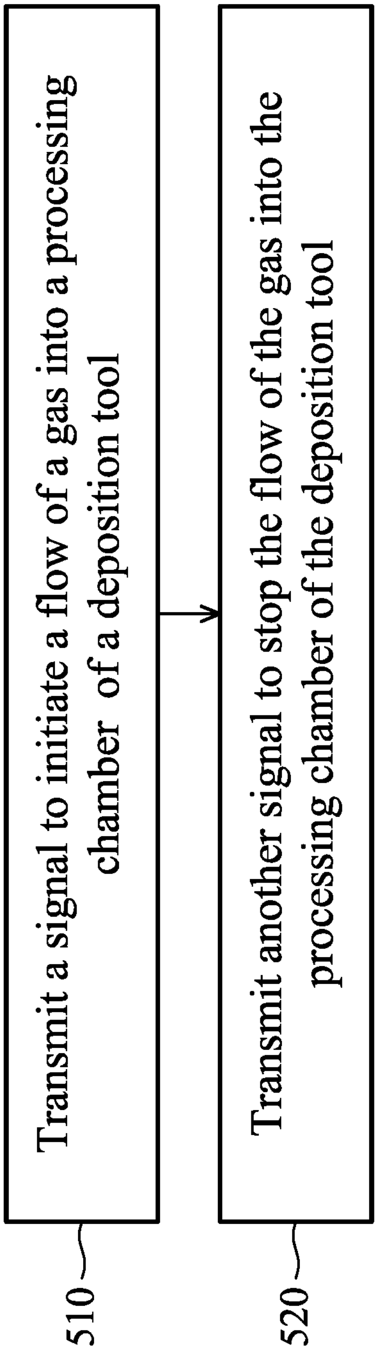
FIG. 5 is a flowchart of an example process associated with performing a deposition operation using a deposition tool having a fixture described herein.

FIG. 5 is a flowchart of an example process associated with performing a deposition operation using the deposition tool 102 having the fixture described herein 134. In some implementations, one or more process blocks of FIG. 5 are performed by a controller (e.g., controller 120). In some implementations, one or more process blocks of FIG. 5 are performed by another device or a group of devices separate from or including the controller, such as one or more other components of the deposition tool 102. Additionally, or alternatively, one or more process blocks of FIG. 5 may be performed by one or more components of device 400, such as processor 420, memory 430, input component 440, output component 450, and/or communication component 460.

As shown in FIG. 5, process 500 may include transmitting a signal to initiate a flow of a gas into a processing chamber of a deposition tool (block 510). For example, the controller 120 may transmit, to a gas source 122 of a gas distribution system, a signal to initiate a flow of a gas 124 into a processing chamber 116 of a deposition tool 102, as described above. In some implementations, the gas distribution system provides the flow of the gas 124 through a gas inlet 126 passing through an interior wall of the processing chamber 116 and through an injector nozzle 128 that is elongated parallel to the interior wall. In some implementations, a fixture 134 is coupled to an end portion (and/or another portion) of the injector nozzle 128. In some implementations, the fixture 134 is configurable to overcome one or more forces that deflect the end portion (and/or another portion) of the injector nozzle 128 towards the interior wall. In some implementations, the fixture 134 is configurable to lock to a selected property of the end portion (and/or another portion) to maintain, between the end portion (and/or another portion) and the interior wall, a gap 136 to prevent the end portion (and/or another portion) from colliding with the interior wall and dislodging particulates.

As further shown in FIG. 5, process 500 may include transmitting another signal to stop the flow of the gas into the processing chamber (block 520). For example, the controller 120 may transmit, to the gas source 122, another signal to stop the flow of the gas 124 into the processing chamber 116, as described above.

Process 500 may include additional implementations, such as any single implementation or any combination of implementations described below and/or in connection with one or more other processes described elsewhere herein.

In a first implementation, the selected property corresponds to a diameter of a cross-section of the end portion (and/or another portion) of the injector nozzle 128.

In a second implementation, alone or in combination with the first implementation, the gap 136 is in a range of approximately 0.5 centimeters to approximately 1.0 centimeters.

In a third implementation, alone or in combination with one or more of the first and second implementations, at least one of the one or more forces corresponds to one or more exhaust forces from the flow of the gas 124 through one or more exhaust ports 130 of the injector nozzle 128.

In a fourth implementation, alone or in combination with one or more of the first through third implementations, at least one of the one or more forces corresponds to a vibration force from within the deposition tool 102.

Although FIG. 5 shows example blocks of process 500, in some implementations, process 500 includes additional blocks, fewer blocks, different blocks, or differently arranged blocks than those depicted in FIG. 5. Additionally, or alternatively, two or more of the blocks of process 500 may be performed in parallel.

Some implementations described herein provide techniques and apparatuses for overcoming forces that may deflect an injector nozzle into an interior wall of a thin-film furnace. The implementations include a fixture that is coupled to the injector nozzle. The fixture is configurable to lock to a selected property of the injector nozzle to maintain, between a portion of the injector nozzle (e.g., an end portion and/or another portion) and the interior wall, a gap.

In this way, the portion (e.g., an end portion and/or another portion) is prevented from colliding with the interior wall and dislodging particulates that may contaminate semiconductor product fabricated using the thin-film furnace. By preventing the portion from colliding with the interior wall and dislodging the particulates, a yield of the semiconductor product fabricated using the thin-film furnace may increase. Furthermore, a downtime of the thin-film furnace for cleaning and maintenance may decrease to increase an output capacity of the thin-film furnace.

As described in greater detail above, some implementations described herein provide a method. The method includes transmitting, by a controller to a gas source of a gas distribution system, a signal to initiate a flow of a gas into a processing chamber of a deposition tool, where the gas system provides the flow of the gas through a gas inlet passing through an interior wall of the processing chamber and through an injector nozzle that is elongated parallel to the interior wall, where the fixture is configurable to overcome one or more forces that deflect the injector nozzle towards the interior wall, and where the fixture is configurable to lock to a selected property of the injector nozzle to maintain, between the injector nozzle and the interior wall, a gap to prevent the injector nozzle from colliding with the interior wall and dislodging particulates. The method includes transmitting, by the controller to the gas source, another signal to stop the flow of the gas into the processing chamber.

As described in greater detail above, some implementations described herein provide a deposition tool. The deposition tool includes a processing chamber including an interior wall. The deposition tool includes a gas inlet passing through the interior wall. The deposition tool includes an injector nozzle extending from the gas inlet along a path that is approximately parallel to the interior wall, where the injector nozzle comprises a plurality of exhaust ports configured to provide a flow of a gas received from the gas inlet into the processing chamber. The deposition tool includes a fixture coupled to an end portion of the injector nozzle, where the fixture is configurable to overcome a force, from the flow of the gas through the plurality of exhaust ports, that deflects the end portion towards the interior wall, and where the fixture is configurable to lock to a selected property of the end portion to maintain, between the end portion and the interior wall, a gap to prevent the end portion from colliding with the interior wall and dislodging particulates.

As described in greater detail above, some implementations described herein provide a fixture. The fixture includes a first arm including a first blade region, where the first blade region comprises a first cavity having a first shape that approximates a first portion of an exterior surface of an injector nozzle for a deposition tool. The fixture includes a second arm including a second blade region, where the second blade region comprises a second cavity having a second shape that approximates a second portion of the exterior surface of the injector nozzle for the deposition tool, and where the second blade region and the second cavity oppose the first blade region and the first cavity. The fixture includes a fulcrum connecting the first arm to the second arm. The fixture includes an elastic forcing component to create, in the first arm and the second arm, respective moment forces about the fulcrum, where the respective moment forces translate into a clamping force between the first cavity and the second cavity. The fixture includes a locking component to fix a distance between the first cavity and the second cavity.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

transmitting, by a controller to a gas source of a gas distribution system, a signal to initiate a flow of a gas into a processing chamber of a deposition tool, wherein the gas distribution system provides the flow of the gas through a gas inlet passing through an interior wall of the processing chamber and through an injector nozzle that is elongated parallel to the interior wall, wherein a fixture is configured to overcome one or more forces that deflect the injector nozzle towards the interior wall, wherein the fixture is configured to lock at a dimension of the injector nozzle to maintain, between the injector nozzle and the interior wall, a gap to prevent the injector nozzle from colliding with the interior wall and dislodging particulates, and wherein the fixture comprises:

a portion that engages with the injector nozzle; and a locking component configured to lock the portion at the dimension of the injector nozzle; and transmitting, by the controller to the gas source, another signal to stop the flow of the gas into the processing chamber.

2. The method of claim 1, wherein the fixture is coupled to an end portion of the injector nozzle, wherein the fixture is configured to overcome the one or more forces that deflect the end portion of the injector nozzle towards the interior wall;

wherein the dimension is of the end portion and the locking component is configured to lock to maintain, between the end portion and the interior wall, a gap to prevent the end portion from colliding with the interior wall and dislodging particulates; and wherein the dimension is a diameter of a cross-section of the end portion of the injector nozzle.

3. The method of claim 1, wherein the gap is in a range of approximately 0.5 centimeters to approximately 1.0 centimeters.

4. The method of claim 1, wherein at least one of the one or more forces corresponds to one or more exhaust forces from the flow of the gas through one or more exhaust ports of the injector nozzle.

5. The method of claim 1, wherein at least one of the one or more forces corresponds to a vibration force from within the deposition tool.

6. The method of claim 1, wherein the portion that engages with the injector nozzle comprises:

a first blade region comprising a first cavity; and a second blade region comprising a second cavity.

7. The method of claim 1, wherein the locking component comprises:

a capture pin; and one or more crenulations configured to receive the capture pin.

8. A method, comprising:

providing a flow of a gas, into a processing chamber of a deposition tool, via a gas inlet that passes through an interior wall of the processing chamber and through an injector nozzle, coupled to a fixture via an end portion of the injector nozzle, that extends along a direction of the interior wall, wherein the flow of gas is provided based on:

the fixture overcoming a force that deflects the end portion towards the interior wall; and the fixture locking at a dimension of the end portion to maintain a gap between the injector nozzle and the interior wall, and wherein the fixture comprises:

a first blade region comprising a first cavity having a first shape; and a second blade region comprising a second cavity having a second shape.

9. The method of claim 8, wherein the dimension is a diameter of a cross-section of the end portion of the injector nozzle.

10. The method of claim 8, wherein the injector nozzle comprises a plurality of exhaust ports, arranged in a linear array, configured to provide the flow of the gas received into the processing chamber.

11. The method of claim 10, wherein the plurality of exhaust ports comprises at least one exhaust port facing away from the interior wall and towards a semiconductor substrate located within the processing chamber.

12. The method of claim 8, wherein the force corresponds to an exhaust force from the flow of the gas or a vibration force from within the deposition tool.

13. The method of claim 8, further comprising:

transmitting, by a controller, a signal to initiate the flow of the gas into the processing chamber; and transmitting, by the controller, another signal to stop the flow of the gas.

14. The method of claim 8, wherein the injector nozzle extends approximately parallel to the interior wall.

15. The method of claim 8, wherein the fixture further comprises:

a locking component configured to lock a distance from a first apex of the first cavity to a second apex of the second cavity.

16. The method of claim 15, wherein the locking component comprises:

a capture pin; and one or more crenulations configured to receive the capture pin.

17. A method, comprising:

providing a flow of a gas through an injector nozzle of a processing chamber of a deposition tool, wherein the injector nozzle extends along a direction of an interior wall of the processing chamber, wherein the injector nozzle is coupled to a fixture, wherein the fixture is configured to overcome one or more forces that deflect the injector nozzle towards the interior wall, and wherein the fixture comprises:

a first arm comprising a first cavity;

a second arm comprising a second cavity opposing the first cavity; and a locking component configured to fix a distance between the first cavity and the second cavity.

18. The method of claim 17, further comprising clamping a portion of the injector nozzle between the first cavity and the second cavity to couple the injector nozzle to the fixture.

19. The method of claim 17, wherein the locking component comprises:

a capture pin; and one or more crenulations configured to receive the capture pin.

20. The method of claim 17, wherein the distance is from a first apex of the first cavity to a second apex of the second cavity.

* * * * *